(12) United States Patent
Vollrath

(10) Patent No.: US 6,453,433 B1
(45) Date of Patent: Sep. 17, 2002

(54) REDUCED SIGNAL TEST FOR DYNAMIC RANDOM ACCESS MEMORY

(75) Inventor: Joerg Vollrath, Richmond, VA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/281,021

(22) Filed: Mar. 30, 1999

Related U.S. Application Data (60) Provisional application No. 60/079,821, filed on Mar. 30, 1998.

(51) Int. Cl.[7] .............................................. G11C 29/00
(52) U.S. Cl. ..................................................... 714/718
(58) Field of Search ................ 714/721, 718, 714/719, 720, 704, 708, 715

(56) References Cited

U.S. PATENT DOCUMENTS

| | | | | |
|---|---|---|---|---|
| 4,868,823 A | * | 9/1989 | White, Jr. et al. | 714/720 |
| 4,991,139 A | * | 2/1991 | Takahashi et al. | 365/201 |
| 5,559,739 A | * | 9/1996 | DeBrosse et al. | 365/189.01 |
| 5,610,867 A | * | 3/1997 | DeBrosse et al. | 365/201 |
| 5,615,159 A | * | 3/1997 | Roohparvar | 365/201 |
| 5,677,885 A | * | 10/1997 | Roohparvar | 365/201 |
| 6,173,425 B1 | * | 1/2001 | Knaack et al. | 714/718 |

* cited by examiner

*Primary Examiner*—Phung M. Chung
*Assistant Examiner*—Joseph D. Torres
(74) *Attorney, Agent, or Firm*—Slater & Matsil, LLP (57) ABSTRACT

Disclosed is a method and apparatus for testing a semiconductor memory having a plurality of memory cells arranged in rows and columns and a plurality of sense amplifiers, each for amplifying memory cell signals of a common row or column. In an illustrative embodiment of the method, a voltage level or test pattern is written into at least one target cell of the memory cells. A word line coupled to the target cell is then activated and subsequently deactivated, to thereby modify the voltage level stored in the cell, while the associated sense amplifier is prevented from refreshing the cell as the word line is activated, e.g., by disabling the sense amplifier. A test bit line voltage is then applied to a bit line coupled to the cell to charge the same. Data is then read from the target cell with settings of the associated sense amplifier enabled, and compared to the original voltage level written into the cell. The process is repeated for different test bit line voltages. The method can be used to determine the signals at the sense amplifiers during normal operation of the memory, without employing complex and costly picoprobes.

21 Claims, 6 Drawing Sheets

REDUCED SIGNAL TEST FOR DYNAMIC RANDOM ACCESS MEMORY

This patent claims benefit of the filing date of provisionally filed Patent Application No. 60/079,821, filed Mar. 30, 1998.

TECHNICAL FIELD

The present invention relates generally to semiconductor memories. More particularly, the invention relates to a method and apparatus for testing semiconductor memories such as dynamic random access memories (DRAMs) and synchronous DRAMs to locate defects and/or to measure memory parameters to facilitate optimization of the memory.

BACKGROUND

In the quality control process of present day DRAMs, each memory block is tested for defects by writing patterns of data to the memory cells and then reading from the memory cells to verify that the data can be accurately stored and retrieved. In this manner, various defects within particular cells, groups of cells, word lines, sense amplifiers, and so forth, can be identified. For high density DRAMs having small feature sizes, it is also desirable to measure certain parameters such as the cell signal levels to facilitate optimization of the memory.

A DRAM cell includes a transistor and capacitor for storing a bit of data. When the transistor is activated, the capacitor is accessed for writing data to or reading data from. A plurality of memory cells are typically arranged in rows and columns to form a memory array. The rows are generally referred to as word lines and the columns are referred to as bit lines. One or more of such arrays may comprise a DRAM integrated circuit (IC) or chip.

One example of an arrangement of DRAM cells is known as a folded bit line architecture. In such an architecture, the bit lines are grouped in pairs, each pair being connected to a sense amplifier. One bit line is referred to as the bit line true and the other is referred to as the bit line bar (complementary). The sense amplifier senses and amplifies a data signal from a selected memory cell connected thereto. When a word line is selected and activated, a group of cells which are connected to the activated word line and bit lines are selected. One bit of a bit line pair is connected to the selected word line. Typically, the selected group of cells is referred to as a page. Other cell arrangements include open bit line and open-folded bit line architecture.

During normal operation, prior to reading a cell, the bit lines are pre-charged to a predetermined voltage, e.g., $V_{DD}/2$, where $V_{DD}$ is the logic high voltage level for the memory. In a typical prior art testing approach, this pre-charge voltage $V_{bl}$ is either intentionally varied and written into the cell or varied during readout. However, during a write operation, the information being written into a cell can be limited by write time and signal level. Writing $V_{bl}$ into the cell can result in a different signal. Also, very high or low $V_{bl}$ during readout can result in improper function of the sense amplifier.

As the density of DRAMs is continually increasing, such as from 16 Mb to 64 Mb, 256 Mb and 1 Gb, the specified time required for each memory cell to store a data bit (retention time) is increasing. To realize a higher retention time, a larger cell signal is necessary, e.g., one that results in 200–300 mV signal during sensing if no retention is applied. The sensitivity of the sense amplifier is much higher—it can typically sense signals down to a few millivolts. For high density DRAMs having small feature sizes, it is desirable to measure the cell signal levels, the sense amplifier sensing properties, and the contribution of isolators, bit line coupling and word line to bit line capacitance to the read out signal.

The cell signal can be estimated by taking the cell capacitance and the bit line capacitance into account. Measuring the cell signal on the actual product is difficult. This measurement requires either a special test structure to make contact to the bit lines, or a focused ion beam tool (FIB) to open contacts to bit lines. Small pads are put on the bit lines and the bit line signal is probed with picoprobes. The dense packing of the memory array renders these techniques difficult. Moreover, the physical work at the bit lines and the input capacitance of a picoprobe can influence the measurement precision. Further, substantial time is expended to apply this method to a small sample such as a few memory cells. Accordingly, there is a need for a short, relatively simple electrical test sequence to determine the cell signal by running a special test pattern.

There is also a need to obtain the distribution of the cell signal during sensing for an entire chip under different operating conditions or for different fabrication parameters. The operating point for the array, determined by the word line boost voltage ($V_{pp}$) and the sensing performance can be optimized if data is available for the cell signals of all the cells in the memory chip. Also, the process window for a given fabrication technology can be evaluated by analyzing the signals at the sense amplifiers.

SUMMARY OF THE INVENTION

The present invention relates to testing of a semiconductor memory having a plurality of memory cells arranged in rows and columns and a plurality of sense amplifiers, each for amplifying memory cell signals of a common row or column. In an illustrative embodiment, a voltage level or test pattern is written into at least one target cell of the memory cells. A word line coupled to the target cell is then activated and subsequently deactivated, to thereby modify the voltage level stored in the cell, while the associated sense amplifier is prevented from refreshing the cell as the word line is activated, e.g., by disabling the sense amplifier. A test bit line voltage is then applied to a bit line coupled to the cell to charge the bit line. Data is then read from the target cell with settings of the associated sense amplifier enabled, and compared to the original voltage level written into the cell. The process is repeated for different test bit line voltages.

The invention can be used to determine the signal at the sense amplifier associated with the target cell during normal operation of the memory, without employing complex and costly picoprobes. For example, for a single cell under test, the test bit line voltages can be varied until the output data switches logic state. The cell signal can then be derived from the test bit line voltage at the switchpoint.

The average cell signal at the sense amplifiers can be determined for the entire memory by writing a predetermined pattern into the cells, and incrementing a fail count for different test bit line voltages. The average cell signal can then be derived from the test bit line voltage corresponding to a predetermined fail count, which is a function of the number of cells in the array and the test pattern.

Advantageously, the invention can be used to determine the signals at the sense amplifiers, the bit line coupling, and the contribution of the word lines and isolators to the cell signals. The test has particular utility in the testing of high density DRAMs. Measured data obtainable with the method disclosed herein may be utilized to optimize DRAM performance with respect to the optimum voltage level for the array and the word line voltage. The test can be used to determine, for example, a weak word line, a sense amplifier mismatch, a weak cell or a bad isolator.

BRIEF DESCRIPTION OF THE DRAWINGS

Preferred embodiments of the present invention are described herein with reference to the drawings, in which like reference numerals identify similar or identical components throughout the several figures, wherein.

DETAILED DESCRIPTION OF THE INVENT

The invention relates to testing of semiconductor memories. The invention provides measurement of cell signal levels and other parameters of the memory without employing complex and costly picoprobes. The measured parameters may identify defects as well as facilitate optimization of the memory. For purposes of discussion, an exemplary embodiment of the invention is described in the context of a DRAM chip implemented with a folded bit line architecture. The invention however has broader applications. Merely by way of example, the invention has application in other memory devices such as EDO-DRAM, SDRAM, RAMBUS-DRAM, SLDRAM, MDRAM, or SRAM. Additionally, other cell arrangements such as open and open-folded bit line architectures are also useful.

Figure 1:
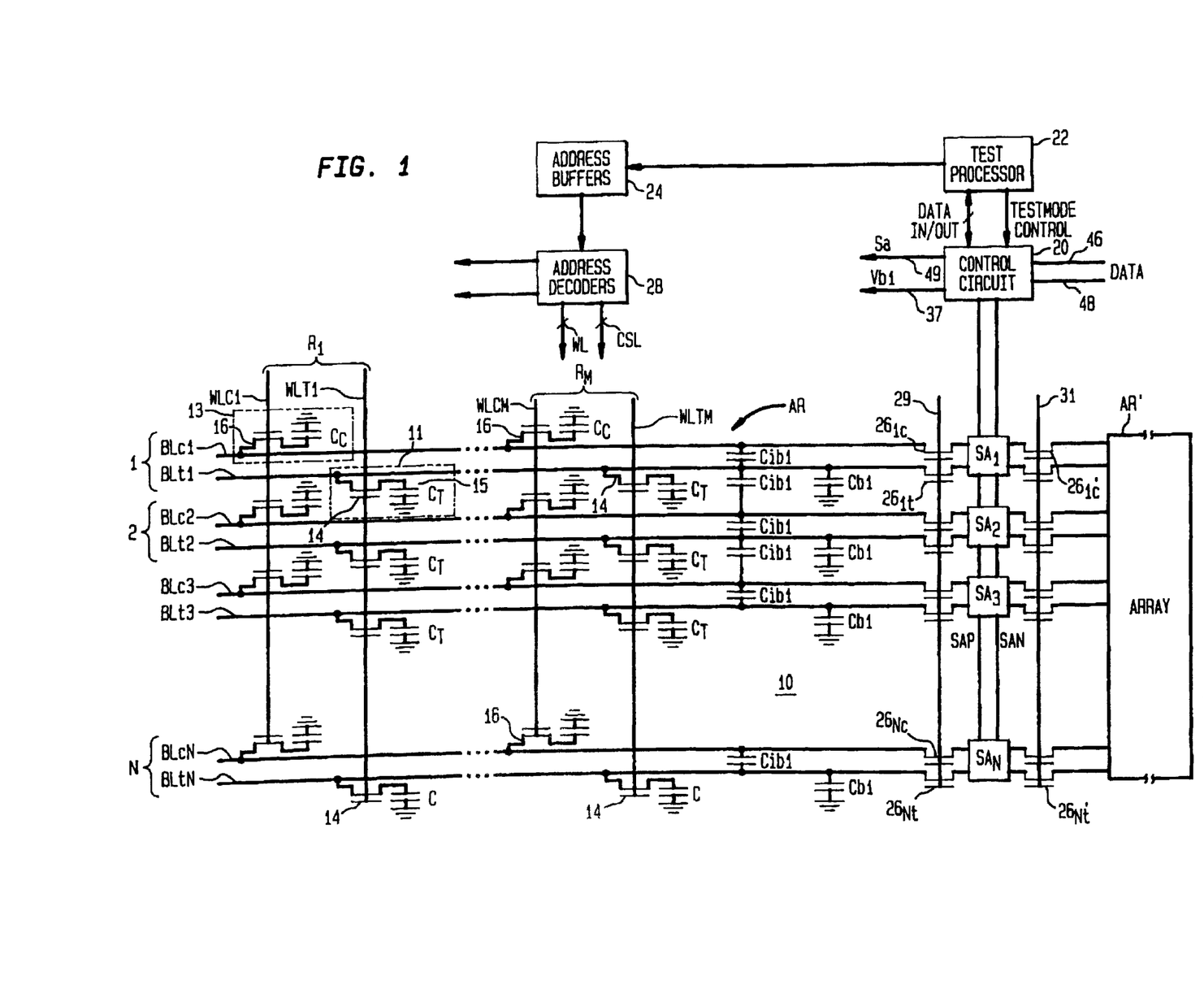
FIG. 1 illustrates a test circuit arrangement to implement a testing method of the present invention.

Referring now to FIG. 1, a circuit arrangement for implementing a test method in accordance with the present invention is schematically illustrated. A DRAM 10 under test includes a pair of subarrays AR and AR'. The subarray AR comprises a plurality of memory cells arranged in M number of rows ($R_1$–$R_M$) by N columns $C_1$–$C_N$. Illustratively the array of memory cells is configured in a folded bit line arrangement. That is, the columns or bit lines are grouped in each pair comprising a bit line true ($BL_t$) and bit line complement ($BL_c$). Within each pair, a given word line accesses a memory cell. For example, $R_1$ accesses memory cell 13 on $C_1$. There are no memory cells accessed by $R_1$ on $C_2$. Memory cell 11 coupled to $C_2$ is accessed by $R_2$. Other configurations such as open or open-folded bit line architectures are also useful. Subarray AR' is typically, although not necessarily, arranged similarly as subarray AR. Although two subarrays are shown, the number of subarrays actually present may vary depending on the size and architecture of the DRAM. In some instances, there may only be one array.

A control circuit 20 is fabricated on the DRAM chip, and operates in conjunction with a test processor 22 to perform testing functions as will be described below. The test processor 22, which for example comprises a personal computer running test software, selects a cell or group of cells to be tested, either automatically or responsive to user input. Addresses corresponding to the selected cells are sent to address buffers 24 of DRAM 10. Address buffers 24 route the addresses to address decoders 28. Address decoders decode the address corresponding to the selected cells. Typically, the decoded address comprise two portions, row and column. The row portion generates a WL signal which selects a page of memory cells by activating the desired word line. The column portion generates a column select signal (CSL) which activates the appropriate sense amplifiers within that page to access the selected cells.

A typical memory cell, such as memory cell 11, comprises of a switching FET 16 14 electrically coupled to a storage capacitor 15. Access to the capacitor is achieved by activating the FET. For example, to execute a write operation to memory cell 11, word line $WL_2$ is activated and the voltage on the bit line $C_1$ is stored in capacitor 15. During a read operation to memory cell 11, the stored voltage of capacitor 15 is transferred to the bit line $C_1$ and amplified by sense amplifier $SA_1$. This stored voltage is referred to herein as the "cell signal". In a folded bit line architecture as shown, a pair of adjacent bit lines are sensed by a sense amplifier. The cell signal from the capacitor of the cell being read causes a voltage difference between the bit line pair. This difference has either a first or second polarity depending on whether a logic 1 or 0 is stored in the memory cell. The sense amplifier senses the difference and amplifies it, outputting a signal corresponding to the information stored in the memory cell.

In a DRAM array, the storage capacitors of the memory cells are designed to have the same capacitance $C_{CELL}$. Additionally, each bit line also has substantially the same capacitance $C_{bl}$. A small interbitline coupling capacitance $C_{xbl}$ exists between adjacent bit lines.

As depicted, a sense amplifier $SA_i$ senses 2 pairs of bit lines, one from subarray AR and the other from subarray AR'. Isolators 26 is are provided to isolate the bit lines from the sense amplifiers to permit selection of the subarray AR or AR' to be accessed.

Figure 2:
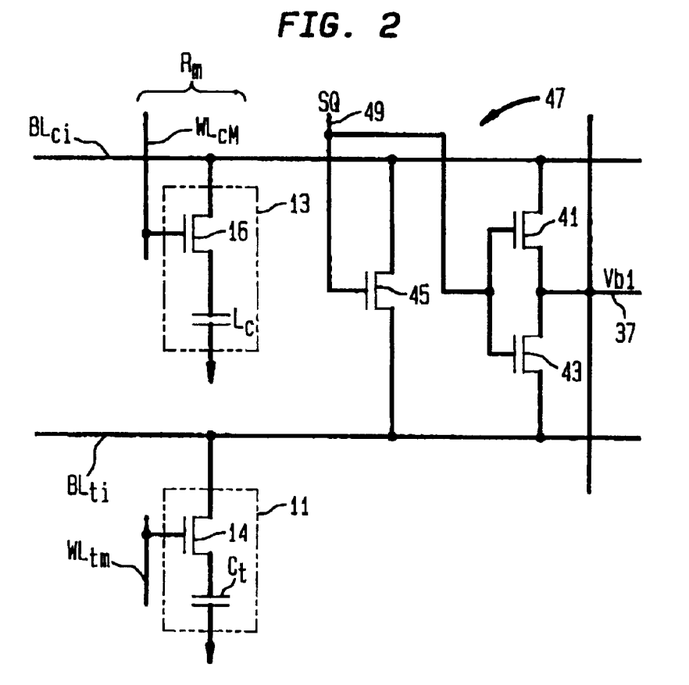
FIG. 2 schematically illustrates circuitry for pre-charging bit lines of a DRAM.

Referring now to FIG. 2 in conjunction with FIG. 1, an equalization circuit 47 is connected to each bit line pair $Bl_c$ and $BL_t$) near row RM closest to the sense amplifier. This circuit functions to pre-charge the bit lines to a precharge voltage $V_{bl}$ derived from control circuit 20 on line 37. FETs 41, 43, and 45 each have their gates coupled to a control line 49 carrying an equalization signal $S_Q$ derived from control circuit 20. Prior to selecting a memory cell to access, the subarray is at its standby condition wherein each bit line is set at $V_{bl}$ by setting $S_Q$ high. In one embodiment, voltage $V_{bl}$ is on the order of $V_{DD}/2$ where $V_{DD}$ is the logic high voltage level for the array. Other levels of $V_{bl}$, such as $V_{DD}$, are also useful. The word lines are held low during standby. When the chip's Row Address Strobe (RAS) is applied, indicating that the subarray is to be, accessed, $S_Q$ is pulled low, isolating each bit line pair from each other and from the $V_{bl}$ pre-charge supply, floating the individual lines at $V_{bl}$. A selected word line and column select line are then pulled high to access the desired cell.

Figure 3:
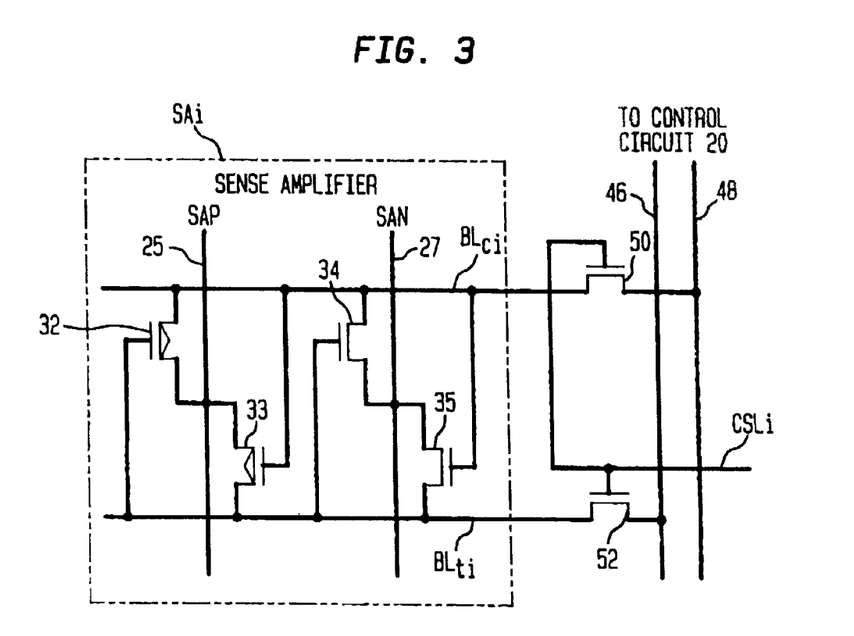
FIG. 3 shows a schematic of an exemplary sense amplifier.

Referring now to FIG. 3, an exemplary sense amplifier circuit $SA_i$ is shown. The sense amplifier includes NFETS 34 and 35 which have their sources tied together and to a line 27 that carries a SAN signal. PFETS 32 and 33 have their drains tied together and to line 25 carrying a signal SAP. The pair of bit lines $BL_t$ and $BL_c$ are coupled to the FETS in a conventional manner. Although not shown in FIG. 1, each sense amplifier such as $SA_i$ is coupled to a pair of column select switches 50 and 52. A column select line $CSL_i$ originating from the address decoder is tied to the gates of FETS 50, 52. Local data lines 46 and 48 are tied to the sources or drains of all FETS 50 and 52, respectively, in the subarray. When column select line $CSL_i$ is activated, the selected memory cell from the pair of bit lines connected to $SA_i$ is accessed.

During normal operation, such as an access with read or write with sensing, SAP, SAN, and the bit lines are pre-set at a voltage level. In one embodiment, the pre-set voltage level is approximately $V_{DD}/2$. Activation of a word line accesses a memory cell from the pair of lit lines ($BL_t$ and $BL_c$). The access, such as a read operation, causes the SAP to be pulled to ground and SAN to be pulled up to $V_{DD}$. Depending on the cell signal of the memory cell being read, one bit line is pulled up to $V_{DD}$ and the other is pulled down to ground. For example, if the selected cell is located on $BL_t$ and the charge stored therein represents a logic one, then $BL_t$ is pulled up to $V_{DD}$ and $BL_c$ is pulled down to ground (and vice versa for a "0" stored in the true cell). DRAMs require refreshing periodically, that is, the memory cell signal stored in the memory cells require to be restored because an inherent attribute of DRAMs is that current leaks from the cells, degrading the cell signal stored therein. As such, the cells are refreshed before the signal is degraded to a level such that the sense amplifier cannot distinguish the original signal stored in the cells. A refresh includes reading the cells to determine the logic level of the signal stored. The cell signal from the cells is sensed, amplified, and written back to the memory cells to restore the signal in the cells to its full level.

The cell signal of the cell being read is transferred to the bit line to which the selected cell is connected. Due to the capacitance ratio $C_{cell}/(C_{cell}+C_{bl})$, this signal is reduced. In accordance with the invention, this signal is written back to the cell from which it was read. In one embodiment, the invention employs a refresh to read the signal and write it back to the cell. However, as described above, the write back in the refresh restores the memory with the full cell signal that was stored in the cells before the read. To read and write the reduced signal back to a selected memory cell, the sense amplifier associated with the pair of bit lines on which the selected memory cell is located is disabled during the refresh. Disabling the sense amplifier enables the reduced cell signal to be detected and written back to the target cell.

In one embodiment, the sense amplifier is disabled by, for example, setting SAP and SAN to equal to the pre set voltage level, which is about $V_{DD}/2$. Once disabled and CSL is activated, the voltages on $BL_t$ and $BL_c$ are passed through to the local data lines 46 and 48 which are coupled to the control circuit. The write and read data is thus transferred between test processor 22 and the memory cells through control circuit 20.

Figure 4:
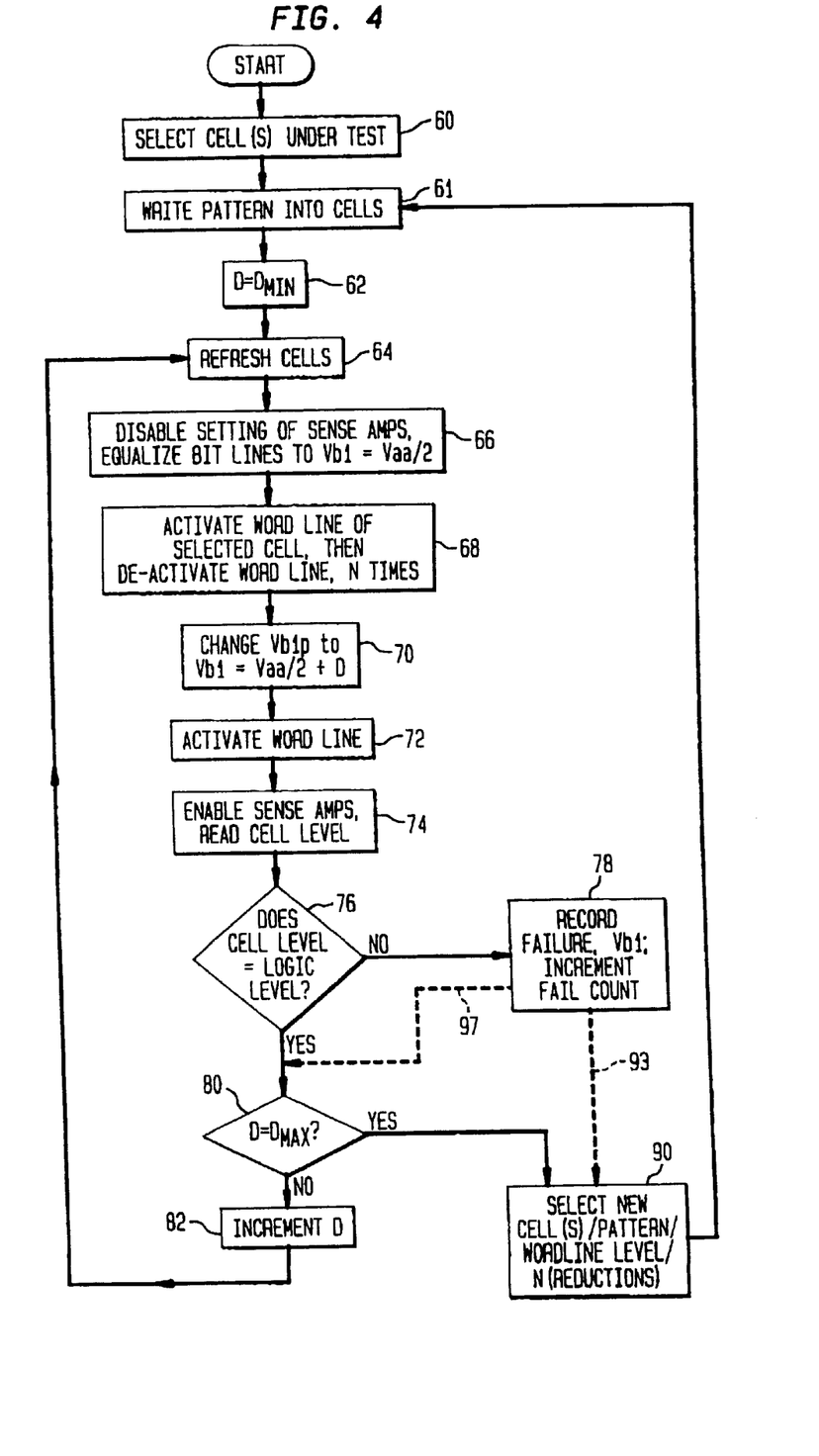
FIG. 4 is a flow diagram illustrating method steps in accordance with the present invention.

FIG. 4 illustrates software flow within test processor 22 to implement a measurement sequence in accordance with the present invention. The test sequence is carried out in conjunction with control circuit 20. The specific design of control circuit 20 is not critical to the present invention and, therefore, the details of such are omitted. A key aspect of the measurement involves decreasing the cell signal by the capacitance ratio $C_{CELL}/(C_{CELL}+C_{bl})$ and sensing the remaining signal at different bit line voltage levels to determine the cell signal. This testflow is called a "reduced signal test". The transfer ratio between $C_{CELL}$ and $C_{bl}$ should be sufficient so as to enable the sense amplifier to detect a signal.

The reduced signal test entails selecting one or more cells under test (step 60). The selected cells are referred to as target cells. In step 61, a logic pattern is written into the target cells. If only a single cell is being tested, a "one" corresponding to $V_{DD}$ volts is written or a "zero", e.g., zero volts, is written. If a group of cells or the entire array is to be tested, a pattern, for example, of all ones, all zeroes or a checkerboard pattern of half zeroes and half ones is written. Other test patterns are also useful. Next, in step 62, a parameter D representing a deviation from a predetermined precharge voltage is set at an initial value $D_I$. Since D is a deviation of $V_{bl}$, the range from which D varies is from about $-V_{bl}$ to $V_{bl}$. In one embodiment, D varies from about $-V_{DD}/2$ to $V_{DD}/2$ for $V_{bl}$ =to about $V_{DD}/2$. Typically $D_I$ is set at its minimum value, which is about $-V_{DD}/2$. The targeted cells are then refreshed in step 64. Other values for $D_I$ between $-V_{DD}/2$ to $V_{DD}/2$ are also useful.

Figure 5A:
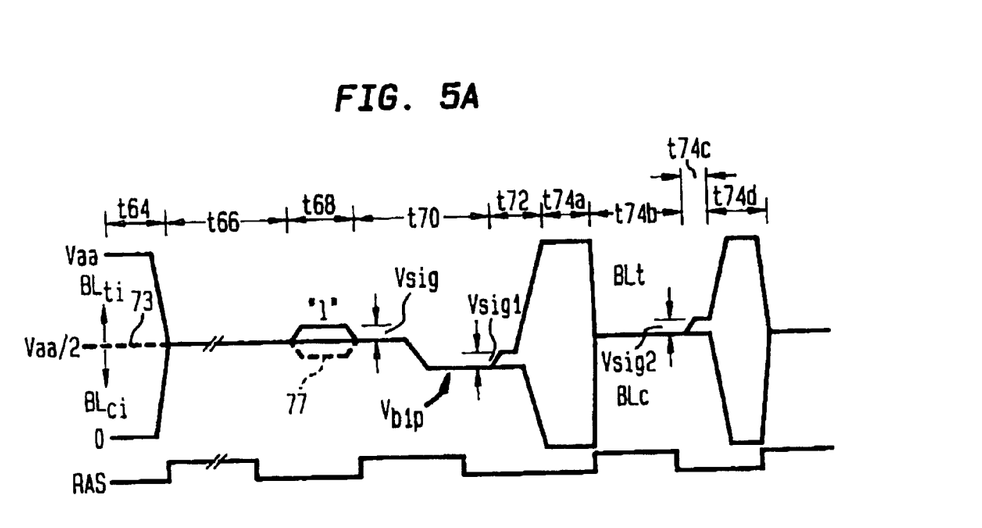
FIGS. 5A–5C are timing diagrams showing exemplary voltage waveforms within a DRAM under test.
Figure 5B:
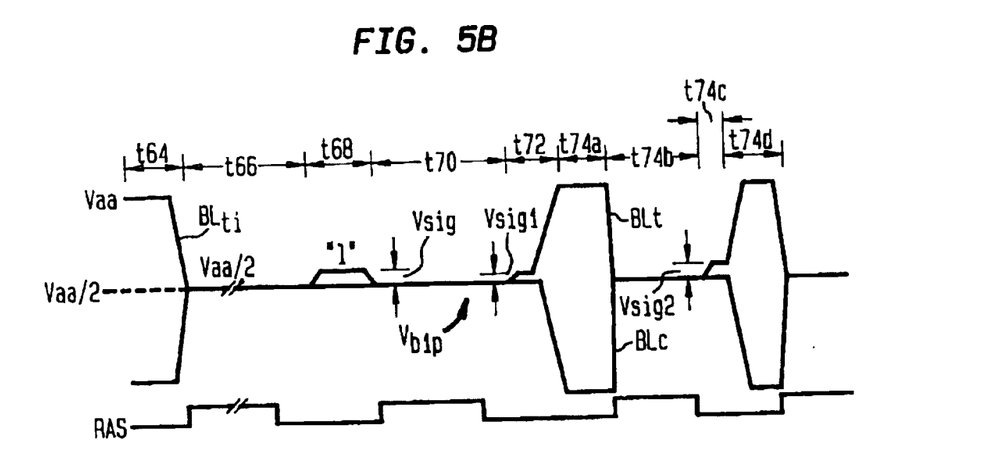
Figure 5C:
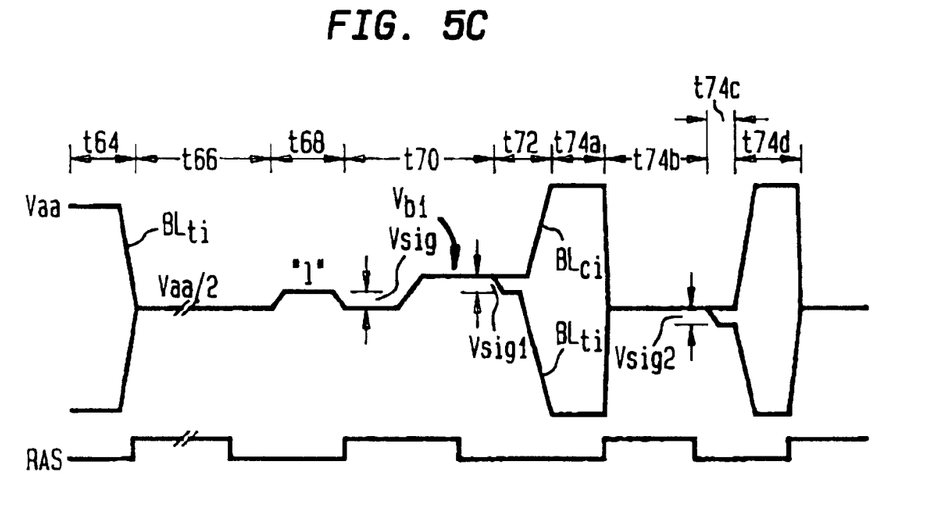

The exemplary test as depicted in FIG. 4 will now be explained further in conjunction with the timing diagrams of FIGS. 5A–5C. The timing diagrams illustrate exemplary voltage levels on a bit line pair $BL_t$ and $BL_c$ generated by accessing a cell connected to one of the bit lines during a test sequence for three different examples. In the timing diagram of FIGS. 5A–5C, voltages on a bit line pair $BL_t$, $BL_c$ are illustrated for the case in which a logic one is written into a target cell connected to $BL_t$. The voltage waveform above dotted line 73 in FIGS. 5A and 5B represents the voltage on $BL_t$ whereas the waveform below line 73 is that on $BL_c$. The corresponding timing for the RAS signal is also shown. The time intervals designated in FIGS. 5A–5C correspond to the steps in FIG. 4. Thus, for example, the first time interval t64 in each figure corresponds to the time of step 64, and so forth.

With continuing reference to FIG. 4, in conjunction now with FIG. 5A, the target cells are refreshed in step 64. Since our exemplary case involves writing a logic one into a target cell on $BL_t$, this results in a level of $V_{DD}$ volts $BL_t$ and zero volts on $BL_c$ during time interval t64. Next, in step 66, the sense amplifier settings are disabled and both sense amplifier input signals SAN and SAP stay at $V_{DD}/2$. During this time, i.e. time interval t66, the bit lines are equalized to a predetermined precharge $V_{bl}$, e.g. $V_{DD}/2$. Next, in step 68, with the sense amplifiers disabled, the word line of a target cell is brought up (activated) and then brought down (deactivated). The sequence of activating and deactivating the word line of the target cell is repeated N times, where N is $\geq 1$. In other words, the target cell is "read" N times, but there is no actual data read out externally. In this example, the word line of the selected cell is activated/deactivated in step 68. When the word line is activated, the charge that was stored in the cell is shared between the cell and the bit line $BL_t$. As seen in FIG. 5A, this results in the $BL_t$ level rising to $(V_{DD}/2+V_{SIG})$ in time interval t68a, where $V_{SIG}$ represents the change in bit line voltage from its precharge level when the word line is brought up. ($V_{SLG}$ also corresponds to the differential voltage input signal to the sense amplifier during normal DRAM operation). The voltage level $(V_{DD}/2+V_{SIG})$ is automatically written back into the cell when the word line is deactivated in step 68. The voltage on $BL_c$ remains at $V_{DD}/2$ in this example because the word line of the cell connected to $BL_c$ remains inactive.

Activating/deactivating the wordline of the selected cells or cell provides test flexibility. For example, when N=1, the cell signal can be determined. Determining the cell signal of any two adjacent N (e.g. N=1 and 2 or 2 and 3), $C_{cell}/C_{BL}$ can be determined. This ratio indicates good or bad cell capacitance. Additionally, choosing N so that there is no signal left in the cell enables the equalized level to be determined. The equalized signal can be used as a reference to, for example, other measurements. Typically, choosing N=8 is sufficient to render the cell signal to equal to zero.

The following equations define the relationship between the signal $V_{SIG}$, the cell voltage initially stored, $V_{CELL}$, the pre-charge (equalization) bit line voltage $V_{bl}$, the cell capacitance $C_{CELL}$ and the bit line capacitance $C_{bl}$:

$$C_{CELL} \times V_{CELL} + C_{bl} \times V_{bl} = (C_{CELL} + C_{bl}) \times (V_{bl} + V_{SIG}) \quad (1)$$

or, $$V_{SIG} = C_{CELL}(V_{CELL} - V_{bl})/(C_{CELL} + C_{bl}) \quad (2)$$

When a logic one ($V_{DD}$) is initially written into the cell, the level ($V_{DD}/2 + V_{SIG}$) that gets written back into the cell in step 68 is reduced compared to $V_{DD}$. A typical value of $V_{SIG}$ is on the order of 250 mV for a $V_{DD}$ of about 3 volts. If a logic zero were initially stored in the cell, $V_{SIG}$ would be negative. This results in a voltage of about 1.5−.25 V=1.25 volts being stored in the cell in the above example after the first reduction. This case is illustrated by dotted line 77 in FIG. 5A. In any case, $V_{SIG}$ will be positive when $V_{CELL}$ exceeds $V_{bl}$ and negative when $V_{bl}$ exceeds $V_{CELL}$.

In the example of FIG. 5A, the number N of reductions is selected to be one. If further reductions are desired, the activation/deactivation of the word line would be repeated. Each reduction would result in a new level stored in the cell in accordance with equations (1) and (2), with the original value of $V_{CELL}$ replaced by the value stored in the previous reduction. The bit line voltage after the first reduction (i.e., $V_{DD}/2 + V_{SIG}$) corresponds to the voltage level that would be on $BL_t$, and incident upon the sense amplifier, during normal DRAM operation. For example, a normal read operation of a target cell located on $BL_t$ results in $BL_c$ being held at the precharge level $V_{DD}/2$ as data is read out from the target cell. Thus, the level $V_{SIG}$ corresponds to the differential input voltage to the sense amplifier during normal operation.

If a group of target cells from different bit lines but the same row are being tested, then a single word line activation in step 68 operates to read from and automatically write the reduced level back into the target cells. To test cells of different rows, the word lines can be activated/deactivated sequentially in step 68 to read/write the corresponding data from/to each cell.

Following the reduction step, the next step is to change the precharge voltage $V_{bl}$ to the value ($V_{DD}/2 + D$), where D is the incremental deviation parameter stored in test processor 22. As mentioned above, D is set initially at a negative value $D_{MIN}$ in this example. This results in the bit line voltage dropping in time interval t70 as shown in FIG. 5A. In the alternative, D can be set initially at a maximum or intermediate value. The new $V_{bl}$ voltage, i.e., ($V_{DD}/2 + D$), is supplied to the equalization circuit 47 FIG. 2) from control circuit 20 responsive to a command by test processor 22. (Control circuit 20 activates equalization circuit 47 by setting signal $S_Q$ high).

With $V_{bl}$ at the new level, equalization circuit 47 is deactivated and the word line is activated in step 72. As seen in time interval t72 of FIG. 5A, the voltage on $BL_t i$ rises from $V_{bl}$ by an amount $V_{SIG1}$ since the charge is again shared between the cell and the bit line. The value of $V_{SIG1}$ will be positive so long as the voltage previously stored in the cell, in this case, ($V_{DD}/2 + V_{SIG}$), is higher than the new value of $V_{bl}$. Since the cell from $BL_c$ is not selected, the voltage on the BLc remains at the new $V_{bl}$ such that the differential voltage applied to the sense amplifier is $V_{SIG1}$. With the word line activated, the sense amplifiers are then enabled (step 74) to thereby amplify $V_{SIG1}$. $V_{SIG1}$ is amplified to a logic high of $V_{DD}$ (time interval t74a) if $V_{SIG1}$ is positive or to a logic low if $V_{SIG1}$ is negative. When the sense amplifier is enabled in step 74, the cell level is read by the test processor. However, the read is preferably performed after a refresh, that is, by first disabling the sense amplifier settings and equalizing the bit lines to $V_{DD}/2$ in time interval t74b, then activating the word line again in interval t74c, and then enabling the sense amplifiers again in interval t74d. In this case, the logic level is read out during interval t74d. When the word line is activated in time interval t74c, the $BL_t i$ voltage is modified by a level $V_{SIG2}$ which is about the same as $V_{SIG}$. As an alternative to reading out data in time interval t74d, the data readout may be performed in the interval t74a. In any case, the test processor compares the measured cell logic level with the logic level originally stored in the cell (step 76). If the measured level does not correspond, e.g., a "0" is detected when a "1" was originally stored, a failure is recorded along with the $V_{bl}$ level in step 78. In this manner, a failure count can be established for a group of cells or for the entire array for that $V_{bl}$ level. Of course, correct (passing) logic level reads can also be recorded if desired. After the failure is recorded in step 78, the software flow proceeds either to step 90, as indicated by dotted line 93, or to step 80, as indicated by line 97, depending on the specific application and/or test sequence design.

If a group of cells of the same row and different columns are being tested, the data can be read out in steps 76–78 sequentially column by column for each $V_{bl}$ level by sequential activation of the CSL lines. To test cells of different rows, $BL_t$ needs to be equalized again at the desired $V_{bl}$ level, then the word line for the next row enabled, and the sense amplifiers enabled to read the cell signals. In other words, steps 70–78 are repeated to read from each different row (assuming step 68 was already performed for the new row under test). In the alternative, the entire sequence of steps 61–78 are repeated to test the cells of each new row at the current $V_{bl}$ level.

Considering for now the case in which a single cell is under test, if the measured cell logic level equals the logic level initially stored in step 76, it is then determined in step 80 if the deviation parameter D equals a predetermined final value, which in this example is $D_{MAX}$. In the illustrative embodiment, $D_{MAX}$ is equal to about $V_{DD}/2$. If not, D is incremented up or down in step 82 and steps 64 to 76 are repeated. Since D has been incremented, the $V_{bl}$ level in step 70 is incremented as well. FIGS. 5B and 5C illustrate voltage waveforms on the bit lines for different $V_{bl}$ levels. In FIG. 5B, D=0V such that $V_{bl} = V_{DD}/2$. In time interval t68, $V_{SIG}$ is the same as in the case of FIG. 5A. In time interval t70, $V_{bl}$ remains at $V_{DD}/2$. As a result, $V_{SIG1}$ in time interval t72 is smaller than the case in FIG. 5A because the difference between the current bit line voltage $V_{DD}/2$ and the stored cell voltage, i.e., ($V_{DD}/2 + V_{SIG}$), is less than in the case of FIG. 5A, whereby less charge is transferred to the bit line from the cell. Nevertheless, since the voltage on $Bl_t$, which is ($V_{SIG1} + V_{DD}/2$), is higher than the voltage on $Bl_c$, which is now $V_{DD}/2$, the sense amplifier will still produce a logic high on $BL_t$ in step t74a and t74d. Hence, the data readout will be a passing one. Eventually, as D is incremented further in step 82, the point will be reached where $V_{bl}$ just exceeds ($V_{DD}/2 + V_{SIG}$). When this occurs, $V_{SIG1}$ will be negative and the $BL_t i$ voltage will decrease in interval t72. This corresponds to the switchpoint for the sense amplifier. The switchpoint is detected in step 76 as the $V_{bl}$ level which causes the sense amplifier output to flip logic state. The accuracy at which the switchpoint can be detected is limited by the sensitivity of the sense amplifier. At the switchpoint, $V_{bl} = V_{DD}/2 + V_{SIG}$. Accordingly, by determining $V_{bl}$ at the switchpoint, the cell signal level $V_{SIG}$ which is the cell signal level during normal DRAM operation, is determined. This allows identification of cells with weak capacitance of strong capacitance. FIG. 5C illustrates the case where $V_{bl}$ is higher than $V_{DD}/2+V_{SIG}$. In time interval t72, $BL_t$ is lowered and the sense amplifier produces a logic zero on $BL_t$ and a logic one on $BL_c$ when enabled in interval t74a. As such, a failure would be detected since a logic one was originally written in the true cell.

When a large number of cells or the entire array is measured, the average switchpoint and average cell signal can be determined by analysis of the fail count as a function of $V_{bl}$. Thus, a table can be generated as to whether a "1" or a "0" was detected in step 76 for different $V_{bl}$ levels over a range, and for different patterns originally written into the array. For each "1" written into a cell, a measured "1" counts as a pass while a measured "0" counts as a fail, and vice versa. As illustrated in FIG. 4, once a predetermined range of $V_{bl}$ levels has been tested, the deviation parameter D is at its final level $D_{MAX}$ in step 80 and the flow proceeds to step 90. Depending on the specific application, the test sequence may then be repeated for a new cell or group of cells, for a new pattern written into the cells, for different word line levels or for a different number N of reductions.

As an alternative to the preferred method of disabling the settings of the sense amplifiers in step 66 and keeping the sense amplifiers disabled during steps 68–72, it is possible to keep the sense amplifiers enabled and switch off the isolators 26 which connect the bit lines to the sense amplifiers. Switching off the isolators will likewise prevent the sense amplifier from refreshing the target cell or cells when the word line is activated, thereby permitting the reduced data to be written into the cell.

In a typical application using the above-described test sequence of FIG. 4, cell signal levels $V_{SIG}$ for both ones and zeroes can be measured and compared. Also, the ratio $C_{CELL}/(C_{CELL}+C_{bl})$ can be determined, preferably by comparing the $V_{bl}$ level at the switchpoint for the single reduction case (N=1) with $V_{bl}$ at the switchpoint for the case of two reductions (N=2). The ratio is then determined from equations (1) and (2) with appropriate substitutions for $V_{CELL}$.

By way of example, for an array voltage $V_{DD}$ of 3.0V, $C_{CELL}=40$ fF and $C_{bl}=200$ fF, a typical measurement gives a signal of:

$$B_{SIG}=(40 \text{ fF}/240 \text{ fF}) \times 1.5V = 250 \text{ mV} \quad (3)$$

For this example, the pre-charge voltage $V_{bl}$ has to be forced to $V_{bl}-V_{SIG}=1.25V$ for a logic zero initially stored or $V_{bl}+V_{SIG}=1.75V$ for a logic one initially stored.

In the above test sequence, there are two major concerns when sensing at different $V_{bl}$ levels. First, the $V_{bl}$ level has to be transferred from the $V_{bl}$ network through some pass transistors to the bit lines. There should be no problem in passing these levels through the equalization circuit 47 (FIG. 2) since there is enough margin with respect to $V_{DD}$ and ground. A second concern is the condition of the sense amplifier during sensing. If the $V_{bl}$ level during sensing is too high or too low, the balance between the NFET sensing and the PFET sensing can be disturbed. Since the signal $V_{SIG}$ is reduced, the level of the input signal to the sense amplifier is close to the normal operating point.

It will be appreciated that there are many benefits to the above-described test sequence. First, the test sequence is carried out without the use of complex and expensive picoprobes. Second, the test can be applied to either one cell, to a group of cells or to an entire chip. Therefore, it is possible to study a single cell failure or the distribution of the cell signal over the entire memory chip. Third, since either zeroes or ones can be written into the cells, the actual cell signals for both of these signals can be determined. Further, different test patterns allow sensing either with or without bit line coupling from adjacent cells. Moreover, varying the number N of reduction steps (step 68 of FIG. 4) can reduce the cell signal to $V_{bl}$. In addition, the transition of: 1) a single cell; 2) all cells connected to a sense amplifier; or, 3) all cells along a bit line or along a word line can be investigated to determine a weak word line, a sense amplifier mismatch, a weak cell or a bad isolator.

If a bitmap tool is available, the transition of a large number of cells can be determined. Grouping these transitions along a bit line gives the distribution of the cell signals, which is mainly due to the cell capacitance variation. Comparing the median or average of the $BL_t$ levels with the median or average of the $BL_c$ levels gives the sense amplifier mismatch and offset. Grouping cells along one word line and comparing the results with that obtained in conjunction with other word lines can determine weak word lines.

For more precise measurements with the aforedescribed test sequence, the coupling between neighboring bitlines can be determined and compensated for. Referring to FIG. 1, if three adjacent $BL_t$s, such as $C_2$, $C_4$, and $C_6$, are accessed, the signals on $C_2$ and $C_6$ are coupling into $C_4$. The capacitance $C_{ibl}$ represents the capacitance between neighboring bit lines, i.e., between true and complementary lines of the same row or of different rows. The difference signal for the sense amplifier $SA_2$ is changed due to voltage from adjacent bitlines coupling onto $C_3$ and $C_4$ due to bitline coupling. In a first approximation, the following voltage difference $V_{COUPLE}$ is coupled to $C_3$ ($BL_c$):

$$V_{COUPLE}=C_{ibl} \times (V_{SC4}+V_{SC2})/(C_{ibl}+Cbl), \quad (4)$$

where $V_{SC4}$ and $V_{SC2}$ are the voltages on the respective bit lines during sense amplifiers sensing. If the test pattern applied to the cells is either an "all ones" or an "all zeroes" pattern applied to the true cells, then the difference signal $V_{SIG}$ will be reduced at the sense amplifier due to bit line coupling. With a checkerboard pattern, i.e., with alternating ones and zeroes applied to the true cells of sequential rows, the term ($V_{SC4}+V_{SC2}$) equals zero and the sense amplifier sees the full signal. Accordingly, by comparing the cell signals for two different patterns, such as an all "1"s pattern and a "1" surrounded by "0"s, the interbitline capacitance $C_{ibl}$ can be determined.

Measurement Results

Measurements based on the above-described test sequence were performed on a first generation 64 MB DRAM. Based on the measurements, a failcount FC was generated as a function of the pre-charge bit line voltage $V_{bl}$. The fail count is a count of incorrect reads from the cells. If the test pattern written into the entire 64 MB array is either all ones or all zeroes, the maximum fail count is 64 MB. For a checkerboard test pattern of half zeroes, half ones, the maximum failcount is 32 MB.

Since the cell signal is distributed gaussian, the $V_{bl}$ level where half of all cells are failing gives the average signal at the sense amplifiers. To obtain a gaussian graph, the trace $FC(V_{bl})$ has to be differentiated by $V_{bl}$. This results in the cells which have their transition at a certain $V_{bl}$ level. The width of the gaussian curve indicates the uniformity of the cell array. The uniformity can also be evaluated for the raw data by taking, for example, the difference in $V_{bl}$ between the 1% and 99% point of failing cells.

Figure 6:
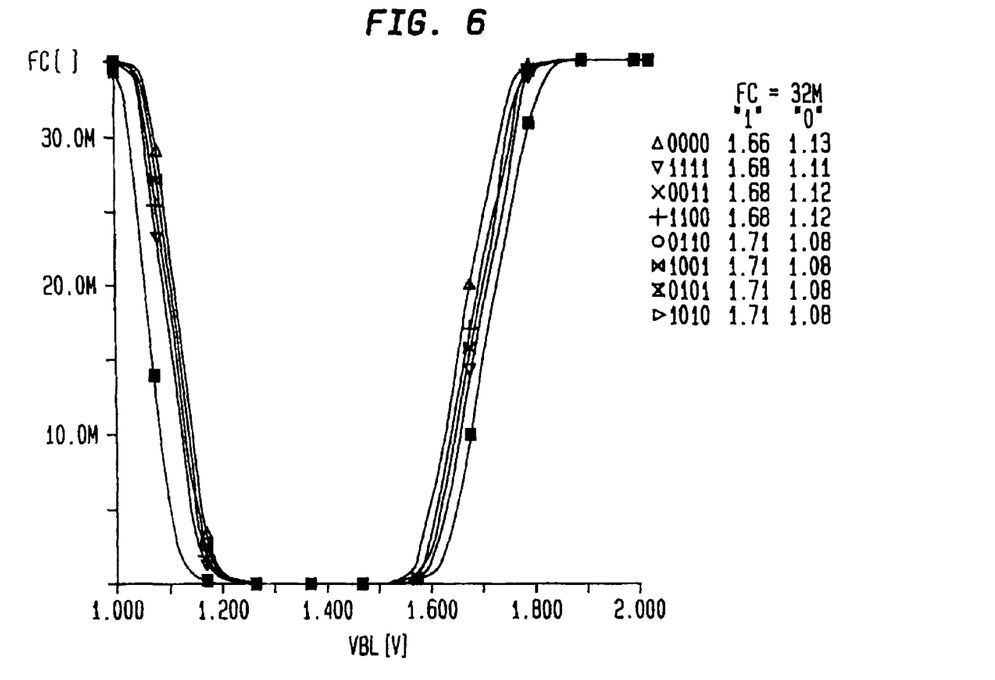
FIGS. 6–7 are graphs of measured results for a DRAM tested in accordance with the present invention.

FIG. 6 shows a typical graph of failcount during readout as a function of $V_{bl}$. The number of failures is low when $V_{bl}$ is in the vicinity of $V_{DD}/2$. For "physical" ones, i.e., logic ones written into the cells, the failcount increases with higher $V_{bl}$ levels above $V_{DD}/2$. For "physical" zeroes, the fail count increases as $V_{bl}$ is reduced towards the minimum in the range. The curves in FIG. 6 are for the case of a single reduction (N=1) for eight different patterns written into the array. Since an all "1"s or all "0"s pattern produce a maximum FC of 64M whereas a checkerboard pattern produces a maximum FC of 32M, the curves are normalized to one another. For an all ones pattern (1111) the average switchpoint $V_{bl}$ for the true cells in the array, i.e. t he $V_{bl}$ level where the failure, count is 16M, was 1.68V. For this pattern, the average switchpoint $V_{bl}$ for the complementary cells (16M failure count) was 1.11V. For the all zeroes pattern, the respective results were 1.66V and 1.13. Taking an average of these two cases gives 1.67V and 1.12V. The average switchpoint $V_{bl}$ for each of the checkerboard patterns, i.e., (0101) and (1010), was 1.71V for the logic ones and 1.08V for the logic zeroes. Comparing the average of the all zeroes/all ones with that for the checkerboard patterns gives the bitline coupling as 1.71–1.676=40 mV (or 1.12–1.08=40 mV). The average signal levels can also be determined by comparing the average switchpoint $V_{bl}$ for ones and zeroes. From the data, the average signal levels ranged from 265 mV to 315 mV.

Figure 7:
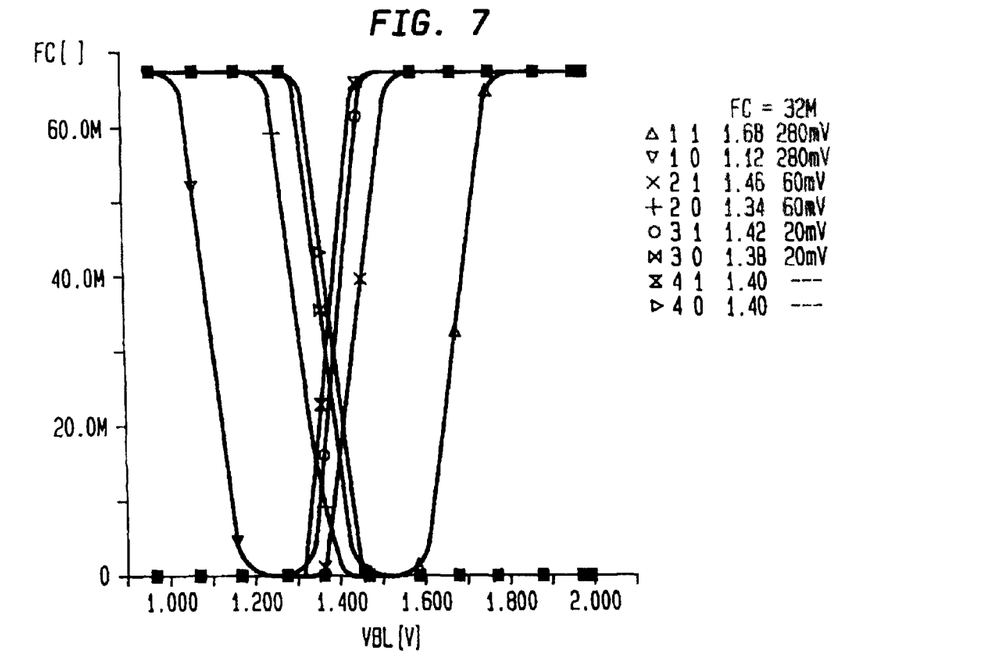

FIG. 7 is a graph of the measured failcount FC as a function of $V_{bl}$ for different numbers "N" of reductions in cell signal. As the number of reductions increase, the "signal" stored in each cells become smaller and smaller, i.e., the voltage stored becomes closer and closer to the equalization voltage $V_{DD}/2$. Thus, where N is relatively large, the average switchpoint $V_{bl}$ is close to $V_{DD}/2$. The curves in FIG. 7 are for two patterns) all zeroes and all ones, and for N varying from one to four. With N=1, the average switchpoint $V_{bl}$ was 1.12V and 1.68V and the average signal was 280 mV. With N=2, the average $V_{bl}$ was 1.46V and 1.34V and the average signal levels were 60 mV. By comparing the results for N=1 and N=2, the average capacitance ratio $C_{CELL}/(C_{CELL}+C_{bl})$ can be determined from eqns. (1) and (2) as 60 mV/280 mV=0.21. Also, it is seen that for N=4, the average cell signal is essentially zero volts within the measurement accuracy of the system.

From the foregoing, thus disclosed is a new method and apparatus for measuring cell signal levels and other parameters of a semiconductor memory which obviates the need for complex and costly picoprobes. While the above description contains many specifics, these specifics should not be construed as limitations on the scope of the invention, but merely as exemplifications of preferred embodiments thereof. For example, while the invention has been described as having particular utility to the testing of DRAMs, it may have application to other types of memories as well. Those skilled in the art will envision many other possible variations that are within the scope and spirit of the invention as defined by the claims appended hereto.

What is claimed is:

1. Method of testing a semiconductor memory having a plurality of memory cells arranged in rows and columns and a plurality of sense amplifiers, each for amplifying memory cell signals of a common row or column, said method comprising:
    a) writing a voltage level into at least one target cell of said memory cells;
    b) after writing the voltage level, activating a word line coupled to the target cell and then deactivating the word line to thereby modify the voltage level stored in the cell during the writing step, and preventing the associated sense amplifier from refreshing the cell as the word line is activated;
    c) charging a bit line coupled to the cell by applying a test bit line voltage thereto; and
    d) reading data from the target cell with settings of the associated sense amplifier enabled.

2. The method of claim 1 wherein said preventing the associated sense amplifier from refreshing comprises disabling settings of the associated sense amplifier.

3. The method of claim 2, further comprising the step of refreshing the target cell prior to disabling the associated sense amplifier.

4. The method of claim 1 further comprising the step of:
    e) repeating at least steps (b) through (d) with different bit line voltages in step (c).

5. The method of claim 4 further comprising the step of comparing the data read in step (d) with the voltage level written into the cell in step (a) for each bit line voltage.

6. The method of claim 1 further comprising precharging a bit line coupled to the target cell with a reference precharge voltage prior to activating the word line in step (b).

7. The method of claim 6 wherein said precharge voltage is about $V_{DD}/2$, where $V_{DD}$ is the logic high voltage level for the memory.

8. The method of claim 1 wherein said memory comprises a dynamic random access memory (DRAM).

9. The method of claim 1 further comprising determining when the data read in step (d) flips logic state and recording the test bit line voltage that caused the output logic state to flip state to allow a determination of the cell signal during normal operation of the memory based upon a difference between the test bit line voltage and a predetermined precharge voltage.

10. The method of claim 1 wherein said step of activating and deactivating the word line is performed a plurality of times to thereby modify the voltage stored within the target cell further.

11. The method of claim 10 further comprising determining interbitline capacitance by comparing cell signal level measured with a single activation/deactivation of the word line with cell signal level determined with at least two activation/deactivations of the word line.

12. The method of claim 1, further comprising repeating steps (a) through (d) for different wordline voltages.

13. The method of claim 1, wherein:
    said step of writing data into at least one target cell comprises writing a first pattern into a plurality of target cells; and
    said method further comprises writing a second pattern into said target cells different than said first pattern and repeating said disabling, reading and enabling steps, and then determining bit line coupling between adjacent bit lines based on the data read for said first and second patterns.

14. The method of claim 13 wherein said first pattern comprises all zeroes or all ones written into at least first, second and third cells connected to adjacent bit lines, and said second pattern comprises a first logic level written into said second cell and a second logic level written into said first and third cells.

15. The method of claim 1 further comprising the step of repeating at least steps (b) through (d) with different test bit line voltages in step (c), and wherein:
    said step of writing a voltage level into at least one target cell comprises writing at least one pattern into all cells the memory; and said method further comprising comparing the data read from each target cell in step (d) with the associated voltage level in step (a) and incrementing a fail count when the data read does not correspond to the associated voltage level, and determining an average cell signal level derived from a test bit line voltage corresponding to a predetermined fail count for the memory, said predetermined fail count being a function of the number of cells in the memory and the pattern written into the cells.

16. The method of claim 1 wherein said preventing the associated sense amplifier from refreshing the cell comprises switching off an isolator coupled between the associated sense amplifier and the bit line.

17. The method of claim 1 wherein the step of writing a voltage level comprises writing a voltage level using the associated sense amplifier.

18. The method of claim 1 wherein writing a voltage level comprises writing a full logical voltage level into the cell.

19. The method of claim 1 wherein preventing the associated sense amplifier from refreshing the cell comprises isolating the sense amplifier from the bit line coupled to the cell.

20. The method of claim 1 wherein activating a word line coupled to the target cell causes charge to be redistributed between the memory cell and the bit line in proportion to there respective capacity.

21. A method of testing a semiconductor memory having a plurality of memory cells arranged in rows and columns and a plurality of sense amplifiers, each for amplifying memory cell signals of a common row or column, said method comprising:
   a) writing a voltage level into at least one target cell of said memory cells using a sense amplifier, said writing comprising writing at least one pattern to all cells of the memory;
   b) disabling the sense amplifier;
   c) with the sense amplifier disabled, activating a word line coupled to the target cell and then deactivating the word line, to thereby modify the voltage level stored in said cell;
   d) pre-charging the bit line with a test voltage;
   e) enabling the associated sense amplifier and reading data from the target cell;
   f) repeating at least steps (b) through e) with different test voltages in step (d); and
   g) comparing the data read from each target cell in step (f) with the associated voltage level written into the cell in step (a) and incrementing a fail count when the data read does not correspond to the associated voltage level, and determining an average cell signal level during normal operation of the memory derived from a test bit line voltage corresponding to a predetermined fail count being, a function of the number of cells in the memory and the pattern written into the cells.

* * * * *